United States Patent [19]

Berenz

[11] Patent Number: 5,940,695
[45] Date of Patent: Aug. 17, 1999

[54] GALLIUM ANTIMONIDE COMPLEMENTARY HFET

[75] Inventor: John J. Berenz, San Pedro, Calif.

[73] Assignee: TRW Inc., Redondo Beach

[21] Appl. No.: 08/729,115

[22] Filed: Oct. 11, 1996

[51] Int. Cl.[6] ............... H01L 21/337; H01L 21/8252
[52] U.S. Cl. ............ 438/172; 438/167; 438/604; 438/606
[58] Field of Search .................. 438/172, 167, 438/604, 606

[56] References Cited

U.S. PATENT DOCUMENTS

| | | | |
|---|---|---|---|
| 5,192,698 | 3/1993 | Schuermeyer et al. | 438/169 |
| 5,214,298 | 5/1993 | Yuan et al. | 257/194 |
| 5,223,451 | 6/1993 | Kawasaki et al. | 438/201 |
| 5,243,206 | 9/1993 | Zhu et al. | 257/192 |
| 5,262,335 | 11/1993 | Streit et al. | 438/313 |
| 5,266,506 | 11/1993 | Green, Jr. | 438/172 |
| 5,420,442 | 5/1995 | Hasenberg et al. | 257/22 |
| 5,429,963 | 7/1995 | Martinez et al. | 438/169 |
| 5,444,016 | 8/1995 | Abrokwah et al. | 438/520 |
| 5,455,429 | 10/1995 | Paoli et al. | 257/20 |
| 5,479,033 | 12/1995 | Baca et al. | 257/192 |
| 5,480,829 | 1/1996 | Abrokwah et al. | 438/169 |

FOREIGN PATENT DOCUMENTS

| | | |
|---|---|---|
| 61-67275 | 4/1986 | Japan . |
| 62-298181 | 12/1987 | Japan . |
| 63-311768 | 12/1988 | Japan . |
| 64-59962 | 3/1989 | Japan . |
| 1-256175 | 10/1989 | Japan . |
| 5-251475 | 9/1993 | Japan . |

Primary Examiner—Richard A Booth
Assistant Examiner—Ha Tran Nguyen
Attorney, Agent, or Firm—Michael S. Yatsko

[57] ABSTRACT

A complementary heterojunction field effect transistor (CHFET) in which the channels for the p-FET device and the n-FET device forming the complementary FET are formed from gallium antimonide (GaSb) or indium antimonide (InSb). An n-type HFET structure is grown, for example, by molecular beam epitaxy (MBE) in order to obtain the highest electron or hole mobility. The complementary p-type HFET is formed by p-type doping of a cap layer thereby eliminating the need for two implants for channel doping. In order to reduce the complexity of the process for making the CHFET, a common gold germanium alloy contact is used for both the p and n-type channel devices, thereby eliminating the need for separate ohmic contacts, resulting in a substantial reduction in the number of mask levels and, thus, complexity in fabricating the device.

20 Claims, 5 Drawing Sheets

1. GROW MBE

2. ALIGNMENT KEY

3. MASK FOR N-CHANNEL IMPLANT

4. IMPLANT Te

5. STRIP MASK & RTA

6. ISOLAION IMPLANT

7. DEPOSIT Au-Ge OHMIC METAL/LIFT/RTA

8. DEPOSIT Cr-Au GATE METAL/LIFT

GALLIUM ANTIMONIDE COMPLEMENTARY HFET

BACKGROUND OF THE INVENTION

1. Field of the Invention

The present invention relates to a complementary heterojunction field effect transistor (CHFET) and a method for making a CHFET, and more particularly, to a CHFET in which the channels for both the p-FET device and the n-FET device forming the complementary structure are formed from either gallium antimonide (GaSb) or indium antimonide (InSb) to provide relatively high electron and hole mobility thereby improving overall performance; the CHFET being formed with common ohmic contacts thereby eliminating the need for separate ohmic contacts for each of the p and n-FET devices to simplify the process for making the CHFET relative to known devices.

2. Description of the Prior Art

Recent trends in advanced communications systems, particularly in satellite communication systems, require lighter weight, smaller size, lower power and lower cost technology. Complementary heterojunction field effect transistors (CHFET) have been shown to be useful for low power and high speed applications. Examples of such CHFETs are disclosed in U.S. Pat. Nos. 5,142,349; 5,192,698; 5,243,206; 5,429,963; 5,479,033; 5,480,829 and 5,544,016.

Such CHFET devices normally include both an n-type FET and a p-type FET formed in a vertically stacked configuration on the same substrate such as gallium arsenide (GaAs). Different materials are known to be used for both the n and p channel layers. For example, in U.S. Pat. No. 5,243,206, gallium antimonide (GaSb) is used for the p-type channel, while indium arsenide (InAs) is used for the n-type channel layer. In U.S. Pat. No. 5,192,698, gallium arsenic antimonide (GaAscSb) is used for the p-type channel layer, while indium gallium arsenide (InGaAs) is used for the p-type channel layer. The particular materials for the p and n-type channel layers are known to be selected, at least in part, to form quantum wells to improve the overall performance of the device. Unfortunately, the performance of such CHFETs is limited by the relatively low mobility of the p-type channel device which limits the speed and increases the overall power consumption of the device.

Another characteristic of such CHEFET devices is that the yield is limited to about 6,000 gate circuits, because of the relative complexity of the fabrication process, known to require about 14 mask levels. Many of the mask levels are due, in part, to separate contacts for both the p and n-type FET devices, for example, as disclosed in U.S. Pat. Nos. 5,192,698; 5,429,963; and 5,479,033.

SUMMARY OF THE INVENTION

It is an object of the present invention to solve various problems in the prior art.

It is yet another object of the present invention to reduce the complexity of forming a CHFET device.

It is yet another object of the present invention to provide a low power CHFET device.

It is yet a further object of the present invention to provide a CHFET device which uses gallium antimonide (GaSb) for both the n-channel and p-channels of a CHFET.

It is yet another object of the present invention to use a common ohmic contact for both the p and n-type FETs in order to reduce the complexity of the fabrication process of such CHFETs.

Briefly, the present invention relates to a complementary heterojunction field effect transistor (CHFET) in which the channels for the p-FET device and the n-FET device forming the complementary FET are formed from gallium antimonide (GaSb) or indium antimonide (InSb). indium antimonide (InSb) and gallium antimonide (GaSb) provides for relatively high electron mobility as well as high hole mobility. An n-type gallium antimonide (GaSb) or indium antimonide (InSb) HFET structure is grown, for example, by molecular beam epitaxy in order to obtain the highest electron or hole mobility. A complementary p-type or HFET is formed by p-type doping of a cap layer in order to thereby eliminate the need for two implants for channel doping. In order to reduce the complexity of the process for making the CHFET, a common gold germanium alloy contact is used for both the p and n-type channel devices, thereby eliminating the need for separate ohmic contacts, resulting in a substantial reduction in the number of mask levels and, thus, complexity in fabricating the device.

BRIEF DESCRIPTION OF THE DRAWING

These and other objects of the present invention will be readily understood with reference to the following specification and attached drawing, wherein.

DETAILED DESCRIPTION OF THE INVENTION

The present invention relates to a complementary heterojunction field effect transistor (CHFET) formed as a vertically stacked layered device in which an n-type or p-type FET is formed by molecular beam epitaxy with n-type or p-type channel, formed from either a indium antimonide (InSb) or gallium antimonide (GaSb) material in order to provide relatively high electron or hole mobility. A p-type or n-type doping material, such as magnesium (Mg) or tellerium (Te) respectively, is ion-implanted into a cap layer to form a high electron or hole mobility p-type or n-type HFET in order to eliminate the need for dual implants for channel doping. A single common alloy ohmic contact is used for the p and n-type devices to eliminate the need for separate contacts in order to reduce the complexity of the process.

Figure 1:
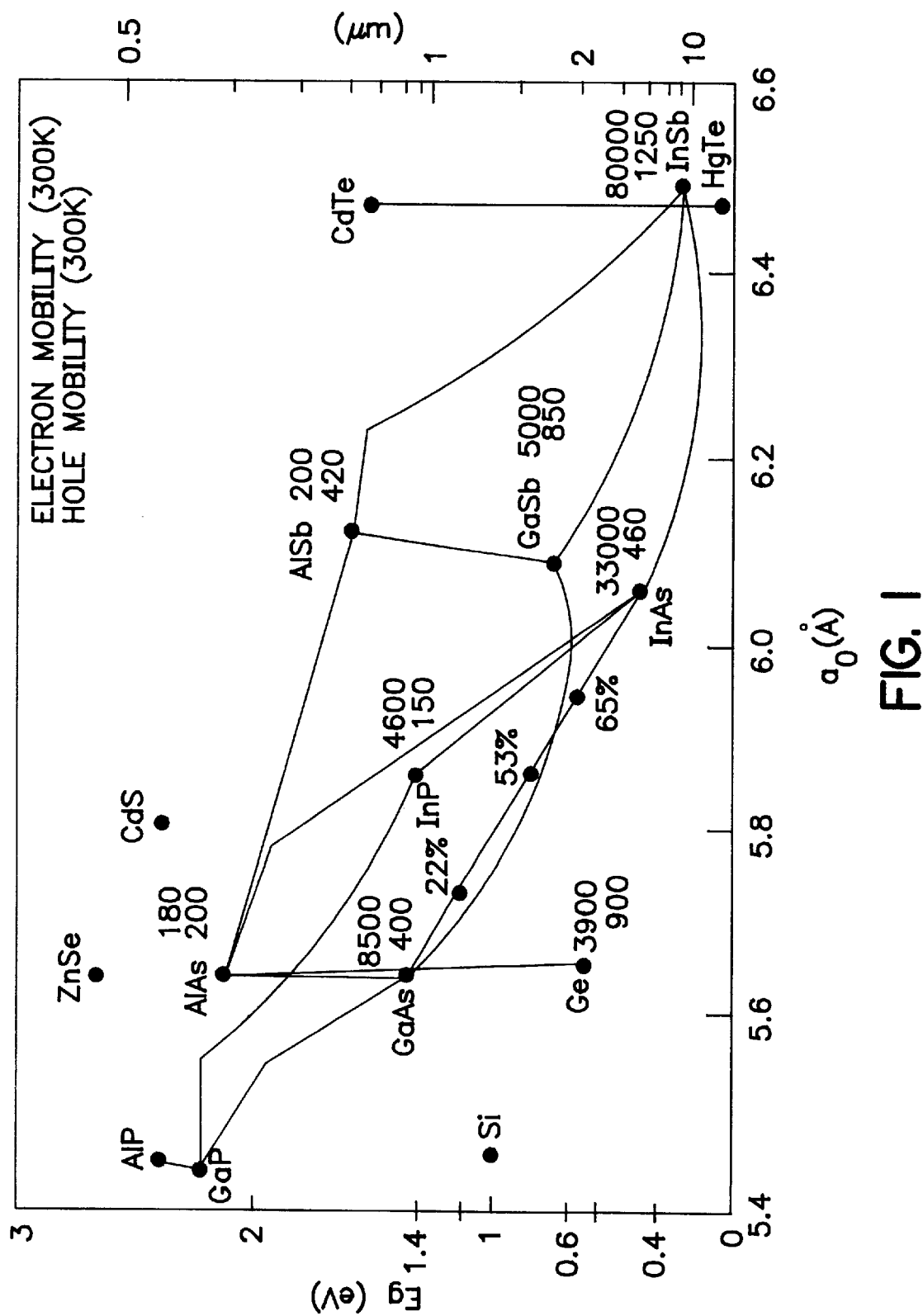
FIG. 1 is a diagram of energy gap vs. lattice constant for various semiconductor materials illustrating the relative electron mobility and hole mobility.

In known CHFET devices, the performance is limited by the low mobility of the p-channel, for example, 400 $cm^2/Vs$ and the complexity of the fabrication process known to include 14 mask levels. The low mobility of the p-channel is known to require higher power for the device, as well as inhibit the overall speed of the device. The present invention utilizes indium antimonide (InSb) or gallium antimonide (GaSb) for the channels of the n-type FET and the p-type HFET, forming the CHFET. In particular, undoped gallium antimonide (GaSb) is a p-type material with a hole mobility of 850 $cm^2/Vs$ more than double that of GaAs. Gallium antimonide (GaSb), doped with an n-type material, such as tellerium (Te), also has relatively high electron mobility of greater than 5,000 cm sq./Vs, as generally shown FIG. 1. Indium antimonide (InSb) which is the preferred embodiment, has the highest electron and hole mobilities of the type III–V semiconductors. Indium antimonide (InSb) is also preferred because of the lower operating voltage (i.e. 0.2 volts) which provides for lower power consumption.

Figure 2:
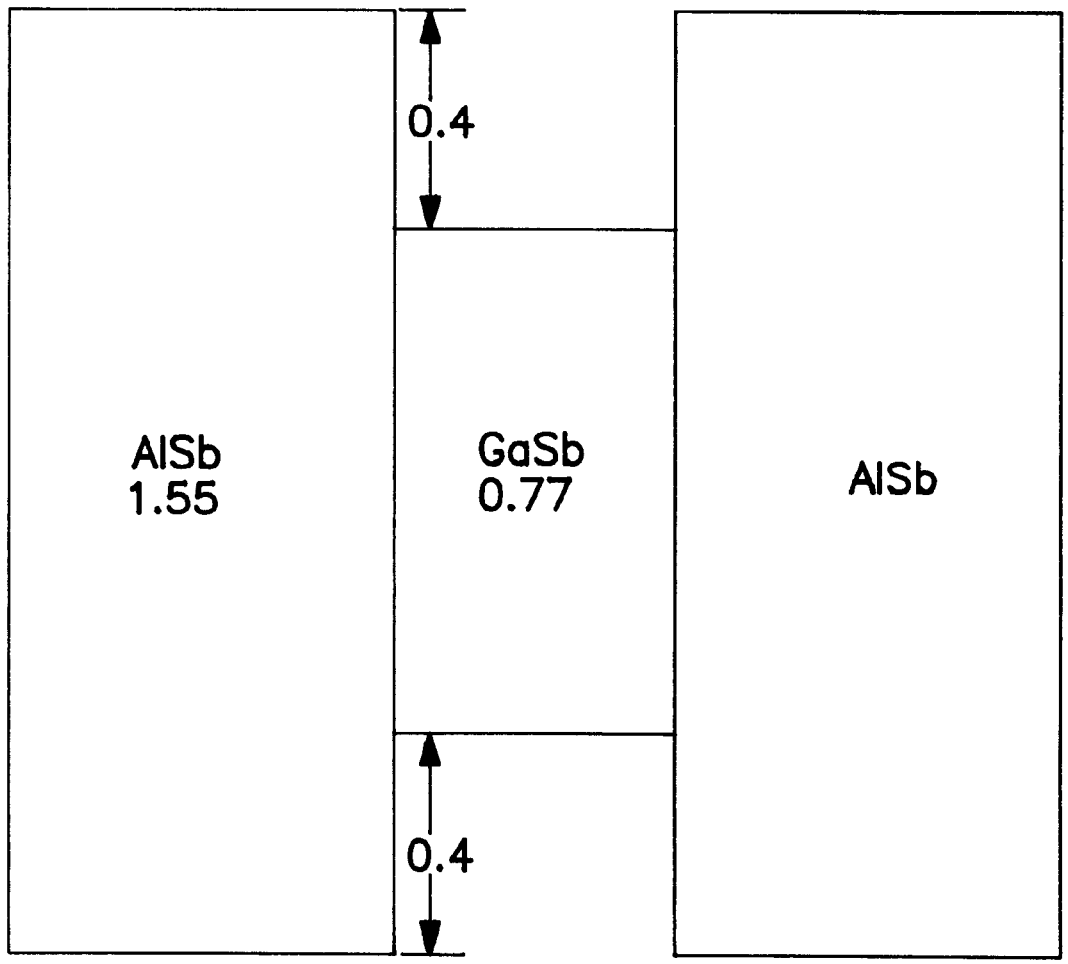
FIG. 2 is an energy band diagram of a gallium antimonide (GaSb) quantum well.

The band gap energy of gallium antimonide (GaSb) is about 0.8 eV, which makes it suitable for low power (1.5 volt) operation. An important aspect of the invention is that the CHFET is formed with a quantum well. The quantum well is formed by sandwiching a gallium antimonide (GaSb) p-channel between layers of aluminum antimonide (AlSb). As shown in FIG. 2, gallium antimonide (GaSb) has nearly equal conduction and valance band discontinuities of 0.4 eV with the aluminum antimonide (AlSb). The quantum well can also be formed utilizing by sandwiching indium antimonide (InSb) between layers of aluminum antimonide (Al Sb)

Figure 3:
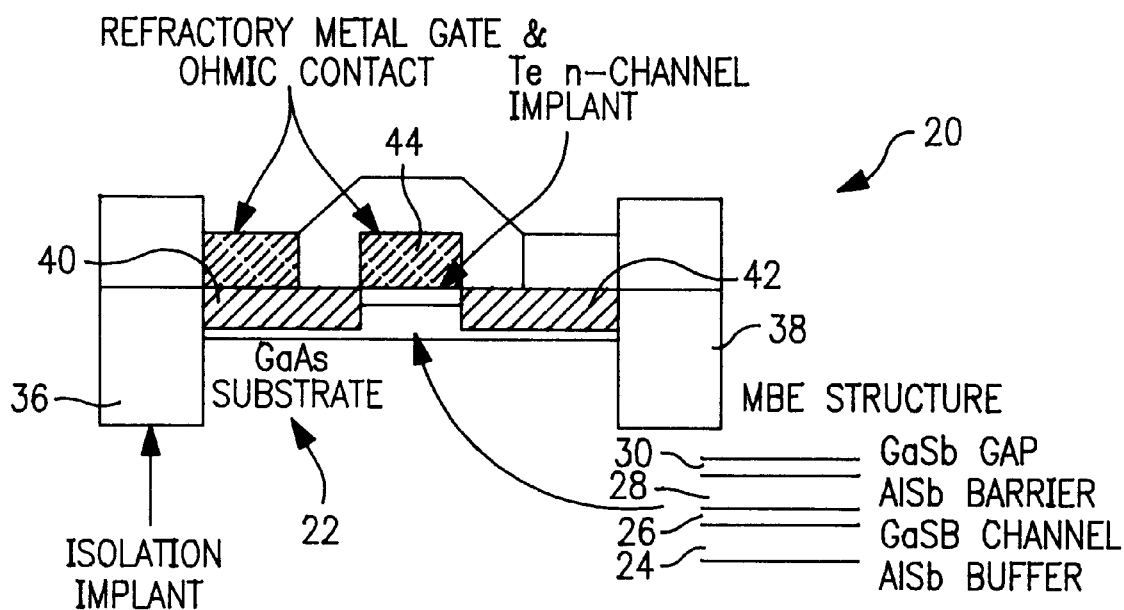
FIG. 3 is a sectional view in elevation of a CHFET in accordance with the present invention.
Figure 5:
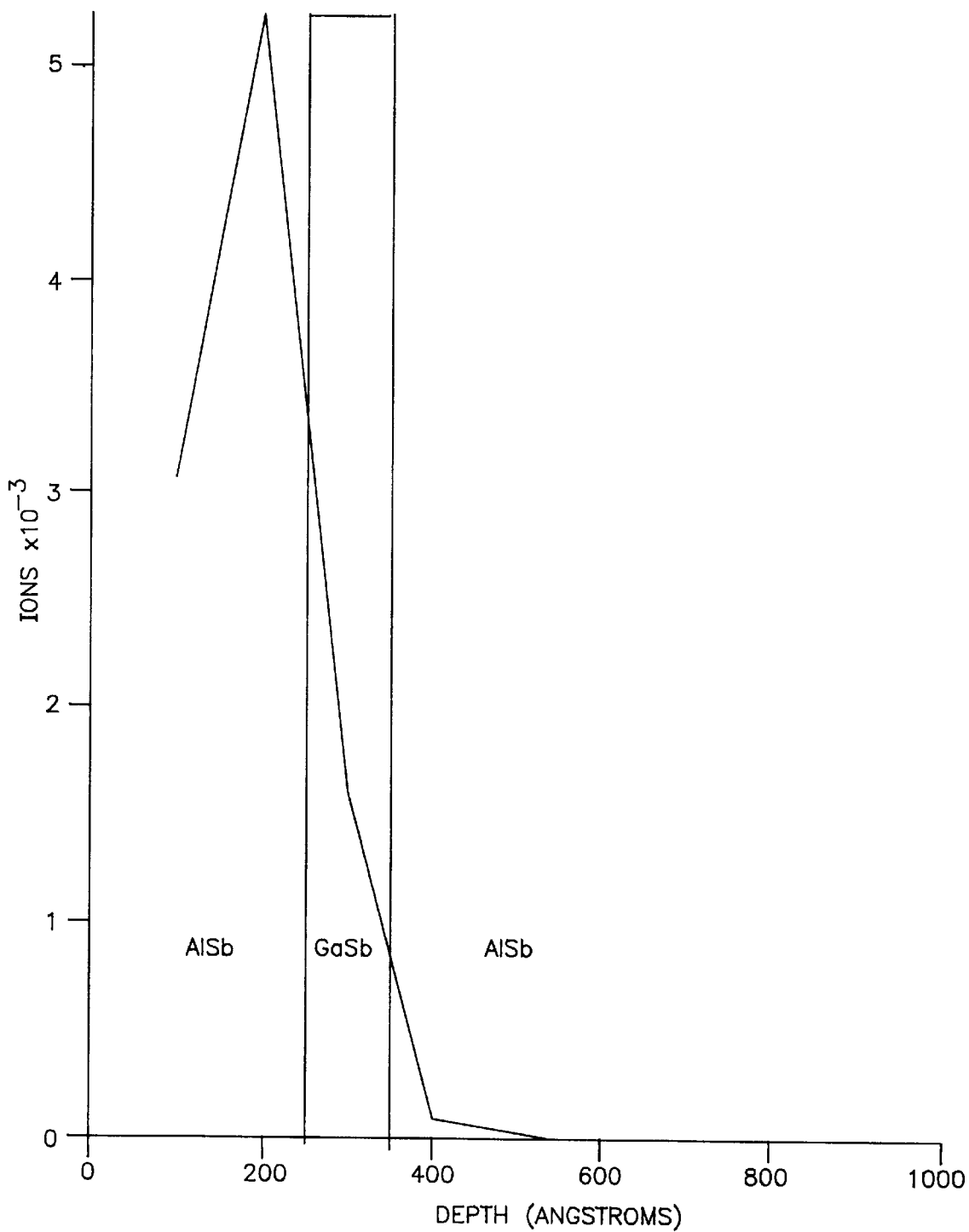
FIG. 5 is a diagram illustrating the ion concentration at 20 keV for a Te-implant into a gallium antimonide (GaSb) material.

FIG. 3 illustrates a cross-sectional view of a CHFET formed in accordance with the present invention. The CHFET, generally identified with the reference numeral 20, includes a suitable substrate 22, for example, gallium arsenide (GaAs) having a thickness, for example, of 4 milliinches. Two embodiments of the invention are contemplated. The structure for both embodiments is essentially the same except for the materials. However, only the preferred alternative embodiment is described in detail. In a first embodiment a p-type FET is epitaxially grown on the substrate 22 and an n-type FET is formed on top of the p-type FET. In particular, a cap layer (discussed below) formed from gallium antimonide (GaSb) or indium antimonide (InSb) is eptiaxially grown on top of the p-FET and doped within n-type material, such as tellerium (Te), as illustrated in FIG. 5. A p-type HFET is epitaxially grown, for example, by molecular beam epitaxy, on the substrate 22. An important aspect of the invention is that both the p-type FET and the n-type FET forming the complementary HFET utilize gallium antimonide (GaSb) or indium antimonide (InSb) for the channel layer. As mentioned above, undoped gallium antimonide (GaSb) provides relatively high hole mobility, while gallium antimonide (GaSb) doped with n-type materials, such as tellerium (Te), also provides relatively high electron mobility to improve the overall clock speed of the device. Indium antimonide (InSb) also provides for relatively high electron and hole mobility.

Alternatively, in a second embodiment an n-type FET is preferably formed by epitaxial growth on the substrate 22 and includes a buffer layer 24, a n-type channel 26, a barrier layer 28 and a cap layer 30. The buffer layer 24 is formed from a relatively wide band gap material, such as aluminum antimonide (AlSb), having a thickness, for example, 1 micron. The n-type channel material 26 is formed from, for example tellerium doped gallium antimonide (GaSb) or indium antimonide (InSb) and is grown on top of the buffer layer 24 to a thickness of 125 angstroms. A barrier layer, formed from a relatively wide band gap material, such as aluminum antimonide (AlSb) is epitaxially grown on top of the n-type channel layer 26 to a thickness of 250 angstroms. The buffer layer 24, n-type channel 26 and barrier layer 28 form the quantum well illustrated in FIG. 2 to provide a relatively low power operation device. A cap layer 30 forms a channel for the p-type HFET. The cap layer 30 is epitaxially grown to a thickness of 50 angstroms on top of the barrier layer 28. As will be discussed in more detail below, a p-type doping material, for example, magnesium (Mg) is implanted into the cap layer 30, for example, by ion implantation, to form an p-type FET.

Figure 4:
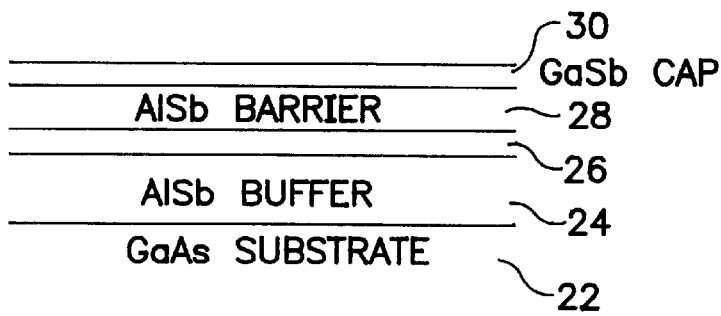
FIG. 4 is a diagram illustrating the steps in fabricating the CHFET illustrated in FIG. 3.
Figure 4:
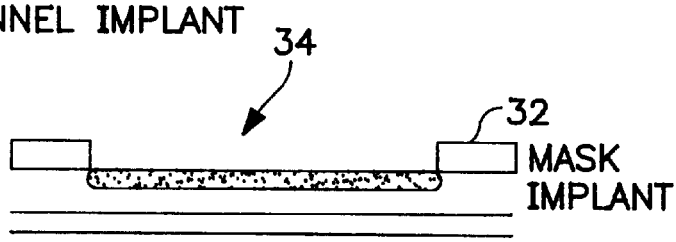
Figure 4:
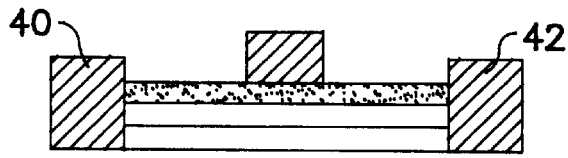

Referring to FIG. 4, once the buffer layer 24, channel layer 26, barrier layer 28 and cap layer 30 are epitaxially grown on the gallium arsenide (GaAs) substrate 22, the structure is aligned in step 2 for the ion implantation step. Ion implantation is used to dope the cap layer 30 with a p-type doping material, such as magnesium (Mg), to form an p-channel for the p-type HFET. The magnesium (Mg) doping material may be implanted with 110 keV energy at a dose of $10^{14}/cm^2$ with the wafer tilted 7° with a 30° rotation. After the structure is aligned for ion implantation in step 2, a mask 32 is formed from either aluminum or photoresist to define the implantation area 34 (FIG. 4) in the cap layer 30. As shown in FIG. 4, the mask 32 is aligned with the structure 20 to enable the magnesium (Mg) ions to be implanted as discussed above, to form the p-channel for the p-HFETs. If a photoresist is used to form the mask 32 for the ion implantation area 34, the mask 32 is stripped in step 5. Subsequently, rapid thermal annealing, for example 600° C. for 30 seconds, is used to activate the implant and remove any radiation damage. An important aspect of the invention is that only a single implant is required for channel doping.

As indicated in FIG. 4, in step 6, an isolation implant is used to separate the CHFETs 20. Although not shown, an isolation mask is formed to define the isolation implant areas 36, 38, etc. (FIG. 3). The isolation implants are formed by ion implantation of an impurity, such as boron ions, at selected energy levels in order to destroy the characteristics of the various layers 22, 24, 26, 28 and 30 of the device in order to provide isolation between adjacent CHFETs 20.

Another important aspect of the invention relates to use of a common ohmic contact for both the p-type and n-type devices and takes advantage of the fact that gold contacts are ohmic on a p-GaSb material and form a rectifying shortly diode on an n-GaSb material. Thus, referring back to FIGS. 3 and 4, common ohmic contacts 40 and 42 are formed on the device 20. In particular, referring to FIGS. 3 and 4, the contact areas 40 and 42 are patterned on a mask (not shown). A layer of photoresist is spun on top of the device. The mask, patterned with the electrodes 40 and 42, is then placed on top of the photoresist. Reactive ion etching may then be used to etch into the various layers of the device, down to the buffer layer 24 to form the electrode areas 40 and 42. A gold germanium alloy, for example, 88% gold (Au), 12% germanium (Ge), may then be deposited on top of the device to form the common electrodes 40 and 42. The excess metal and photoresist is then lifted off by conventional techniques the structure is then subjected to rapid annealing again, as discussed above. After the ohmic contacts 40 and 42 are formed, a gate metal in the metal gate region 44 is formed by a similar process in step 8, except that reactive ion etching is not required. In order form the base metal contact 44, a layer of photoresist (not shown) may be spun on top of the device. A mask configured in the shape of a base metal contact 44 may then be patterned and placed over the photoresist. A photoresist may then be exposed in a conventional manner, to expose the telleriam (Te) doping layer 31. The gate metal, for example, a Cr—Au alloy, chromium (Cr) covered with gold (Au) is then deposited on top of the device with excess metal being lifted off by a conventional lift-off process to form the CHFET 20 in accordance with the present invention.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A process for forming a complementary heterojunction field effect transistor (CHFET), the process comprising the steps of:
 (a) providing a predetermined substrate;
 (b) forming first type HFET on said substrate with a predetermined channel layer and a cap layer;
 (c) forming a second-type HFET on said first type HFET;
 (d) doping said cap layer with a second type dopant to form a channel for said second type HFET, said channels for said first type and second type HFETS being formed from the same material;
 (e) forming common ohmic contacts for said first type and said second type HFETs; and
 (f) forming a common gate contact.

2. The process as recited in claim 1, wherein said predetermined substrate is gallium arsenide (GaAs).

3. The process as recited in claim 1, wherein said first type HFET is formed by molecular beam epitaxy.

4. The process as recited in claim 3, wherein said first-type HFET includes a buffer layer, a channel layer, and a barrier layer.

5. The process as recited in claim 4, wherein the materials for said buffer layer, channel layer and barrier layer are selected to form a quantum well.

6. The process as recited in claim 5, wherein said channel layer is formed from gallium antimonide (GaSb).

7. The process as recited in claim 6, wherein said cap layer, is formed from gallium antimonide (GaSb).

8. The process as recited in claim 5, wherein said quantum well is formed from aluminum antimonide (AlSb), gallium antimonide (GaSb) and aluminum antimonide (AlSb).

9. The process as recited in claim 1, further including the step of isolation implantation for providing isolation between adjacent CHFETs.

10. The process as recited in claim 1, wherein said ohmic contacts are formed from a predetermined gold alloy.

11. The process as recited in claim 1, wherein said gate contact is formed at least in part from a gold.

12. The process as recited in claim 5, wherein said channel layer is formed from indium antimonide (InSb).

13. The process as recited in claim 12 wherein said cap layer is formed from indium antimonide (InSb).

14. A process for forming a complementary heterojunction field effect transistor (CHFET) the process comprising the steps of:
 (a) providing a predetermined substrate;
 (b) forming a first type HFET, said first type HFET having a first predetermined channel layer;
 (c) forming a second type HFET, said second type HFET having a second predetermined channel layer; said first predetermined channel layer and said second predetermined channel layer being formed from the same material, one of said first and second predetermined channel layers being doped with a predetermined dopant; and
 (d) forming ohmic and gate contacts for said CHFET.

15. The process as recited in claim 14, wherein a common gate contact is used for both of said first type and said second type HFETS forming said CHFET.

16. The process as recited in claim 15, wherein common contacts are used for said first type and second type HFETS.

17. The process as recited in claim 14, wherein said substrate is formed from gallium arsenide (GaAs).

18. The process as recited in claim 14, wherein said first type HFET is formed is said substrate and said second type HFET is formed on top of said first type HFET.

19. The process as recited in claim 14, wherein said predetermined material is gallium antimonide (GaSb).

20. The process as recited in claim 14, wherein said predetermined material is indium antimonide (InSb).

* * * * *